(12) United States Patent
Koopman et al.

(10) Patent No.: US 8,173,216 B2
(45) Date of Patent: May 8, 2012

(54) METHOD AND DEVICE FOR PRODUCING A BASE MATERIAL FOR SCREEN-PRINTING, AND BASE MATERIAL OF THIS TYPE

(75) Inventors: Wilfried Franciscus Maria Koopman, Molenhoek (NL); Jacob Jacobus Poelman, Beugen (NL); Johannes Franciscus Gerardus Koster, Venzelderheide (NL); Stephanus Gerardus Johannes Blankenborg, Nijmegen (NL)

(73) Assignee: Stork Prints B.V., Boxmeer (NL)

( * ) Notice: Subject to any disclaimer, the term of this patent is extended or adjusted under 35 U.S.C. 154(b) by 1371 days.

(21) Appl. No.: 11/661,562

(22) PCT Filed: Sep. 1, 2005

(86) PCT No.: PCT/NL2005/000633
§ 371 (c)(1),
(2), (4) Date: Apr. 12, 2007

(87) PCT Pub. No.: WO2006/025739
PCT Pub. Date: Mar. 9, 2006

(65) Prior Publication Data
US 2007/0298180 A1 Dec. 27, 2007

(30) Foreign Application Priority Data
Sep. 3, 2004 (NL) .................................... 1026971

(51) Int. Cl.
*B05D 5/00* (2006.01)
*B05D 1/32* (2006.01)
*B05D 3/12* (2006.01)
*B41F 15/34* (2006.01)

(52) U.S. Cl. ............... 427/258; 427/355; 427/372.2; 427/412.1

(58) Field of Classification Search .......... 427/402, 427/407.1, 258, 355, 372.2
See application file for complete search history.

(56) References Cited

U.S. PATENT DOCUMENTS

| 4,076,535 A | 2/1978 | Vander Putten |
| 4,302,528 A | 11/1981 | Sano et al. |
| 4,705,608 A | 11/1987 | Keller et al. |
| 6,766,817 B2 | 7/2004 | da Silva |

(Continued)

FOREIGN PATENT DOCUMENTS

EP 0 150 623 A2 8/1985
(Continued)

OTHER PUBLICATIONS

Communication dated Jan. 26, 2011 from a Foreign Patent Office in a counterpart foreign application.
(Continued)

*Primary Examiner* — William Phillip Fletcher, III
(74) *Attorney, Agent, or Firm* — Hoffman & Baron, LLP

(57) ABSTRACT

The invention relates to a method and device for producing a base material (10) for screen-printing. This base material (10) comprises a screen (12), a resist layer (30) of resist material and a protective film (22). In the method according to the invention, the base material (10) is assembled from the various components. More particularly, the method comprises at least the steps of applying a first resist layer (30) to one side of the screen (12), and then applying the protective film (22) to the first resist layer (30) on the screen. The invention also relates to the base material (10) itself.

12 Claims, 2 Drawing Sheets

U.S. PATENT DOCUMENTS

| | | |
|---|---|---|
| 6,918,404 B2 | 7/2005 | da Silva |
| 7,066,586 B2 | 6/2006 | da Silva |
| 2007/0287092 A1 | 12/2007 | Blackenborg |

FOREIGN PATENT DOCUMENTS

| | | | |
|---|---|---|---|
| GB | 2 176 630 A | * | 12/1986 |
| GB | 2176630 | | 12/1986 |
| JP | 58-116540 | | 7/1983 |
| NL | 1025774 | | 5/2004 |
| WO | WO 2005/091075 A2 | * | 9/2005 |

OTHER PUBLICATIONS

English abstract for JP 58-116540, Nov. 7, 1983.

* cited by examiner

METHOD AND DEVICE FOR PRODUCING A BASE MATERIAL FOR SCREEN-PRINTING, AND BASE MATERIAL OF THIS TYPE

CROSS-REFERENCE TO RELATED APPLICATIONS

This application is the National Stage of International Application No. PCT/NL2005/000633, filed Sep. 1, 2005, which claims the benefit of Netherlands Application No. NL 1026971, filed Sep. 3, 2004, the contents of which is incorporated by reference herein.

FIELD OF THE INVENTION

The invention relates to a method for producing a base material for screen printing which as components comprises a screen, a resist layer of resist material and a protective film, the method comprising assembling the base material from the components.

BACKGROUND OF THE INVENTION

A method of this type is known from Dutch laid-open patent application No. 1025774 in the name of the present Applicant. In this known method, a first resist layer of photosensitive resist material is applied to one side of the protective film, and this resist layer is then dried. Next, an additional resist layer is applied to this first resist layer, after which the screen is pressed into the additional resist layer, with that side of the additional resist layer on the protective film which faces the screen still being wet. In an alternative method described in the above application, the screen is pressed directly into the resist layer after this resist layer has been applied to the relevant side of the protective film; once again, the side of the resist layer to which the screen is applied needs to be wet. Therefore, this known base material comprises a screen, on one side of which a resist layer with a protective film on it is provided. The protective film has the function of protecting the resist layer during storage, transport and if desired rolling and unrolling of the base material. The result of this known method is that the surface of the resist layer on the side of the protective film has a smoothness which is better than the known base material which is marketed under the trade name "Screeny Siebdruckplatten" by Gallus Ferd. Rusch AG.

When the base material is used for screen-printing, first of all the protective film is removed from the base material. The resist layer is then exposed according to a defined pattern, developed and if appropriate (thermally) cured. The unexposed, uncured parts of the resist layer are removed, so that the screen is uncovered in the regions formed in this way. The base material which has been prepared in this way functions as a stencil in screen-printing. During screen-printing, that side of the stencil which is provided with resist faces towards the substrate that is to be printed. The uncoated side of the stencil comes into contact with the squeegee.

Now, it has been found that for some screen-printing applications, there is a demand for a base material which is coated and protected on one side and in which the screen openings have a high filling level of resist material.

Furthermore, it has been found that when using the base material described in the abovementioned Dutch patent application on the basis of an electroformed screen made from nickel, after the photoresist layer has been developed and cured, there may be occasional weak spots with only moderate adhesion to the screen. These weak spots in the base material can have an adverse effect on the printing quality during screen-printing. The occurrence of these sporadic weak spots occurs in particular at the positions where the resist layer has penetrated less far into the screen, for example as a result of inclusions of air caused by the capillary action of the screen openings, and so-called pinholes.

SUMMARY OF THE INVENTION

Therefore, it is an object of the present invention to provide a method and device for producing a base material for screen printing which has been coated and protected on one side, comprising as components a screen, a layer of resist material and a protective film, which allows a high filling level of resist material in the screen openings to be achieved.

Another object of the invention is to provide a method and device for producing a base material for screen-printing which has been coated and protected on one side, comprising as components a screen, a layer of resist material and a protective film, which further reduces the occurrence of weak spots.

For this purpose, according to the invention the method of the type described above is characterized in that the method at least comprises the steps of
a) applying a first resist layer to one side of the screen, and
b) then applying the protective film to the first resist layer on the screen.

In the method according to the present invention, the screen is pre-coated on one side with a first resist layer of resist material, preferably photosensitive resist material, after which the screen, preferably an electroformed screen, which is provided with this resist layer is laminated to the protective film, in such a manner that the screen, resist and film are bonded to one another. If desired, a resist layer may be present on the protective film. The protective film may also be in the form of an adhesive film, comprising a film which is provided with an adhesive, such as glue, on a main surface. By applying resist in the screen openings, in other words pre-coating the screen, it is ensured that the resist flows well into the screen openings and penetrates them, so that there is sufficient resist in the screen openings with good adhesion to the screen. The filling level of the screen of the base material with resist material produced in accordance with the method of the present invention is therefore greater than in the case of the base material according to the prior art. In the prior art, the volume of resist in the holes of the screen decreases considerably as a result of the drying step and resultant shrinkage of the resist, and consequently the base material has a filling level (defined as the quotient of the thickness or height of the resist layer in the openings of the screen and the thickness of the screen * 100%) of the order of magnitude of 50%. The base material which is coated and protected on one side that is produced in accordance with the present invention can achieve a higher filling level of at least 60%, more preferably at least 75%, even more preferably more than 80%. Obviously, the maximum filling level is 100%. The result of this is that when the base material according to the invention is used for screen-printing, after exposure, developing and curing, a high print quality is achieved.

In addition, the method according to the invention offers the advantage that if any of the abovementioned pinholes are present in the screen—in this case one or more dykes are interrupted locally in the screen material—these pinholes are likewise filled during the coating step. In the case of the above-described method in accordance with the abovementioned Dutch patent application, if pinholes of this type are present in the screen, locally thin and therefore more vulnerable spots in the resist layer compared to the surrounding areas of resist may also form, which would likewise give rise to a reduced print quality.

Incidentally, it should be noted here that U.S. Pat. No. 4,302,528 describes a method for producing a base material for, inter alia, screen-printing, which comprises a screen provided on both main surfaces with resist material which is protected by layers of film. In this case, screen material in web form is provided with resist material on both sides by being submerged in or coated with a liquid photosensitive resist material. Then, the screen material provided with resist material in this way is enclosed between two films and then passed through a nip in order to set the final thickness of the base material. This method is intended, inter alia, to reduce the occurrence of air bubbles and/or creases in the method described in U.S. Pat. No. 4,216,287.

However, base material which is coated with resist material on both sides has a number of drawbacks. For example, during the exposure step during pretreatment to form a stencil, it is customary for the base material to be exposed from one side through a mask in order to cure the photoresist, so that the unexposed parts, which form the image to be printed, can then be removed. However, when using base material which is coated with resist on both sides of the screen, it is uncertain whether the resist material on the shadow side (the side which is not directly exposed) of the screen will be exposed to a sufficient extent and at the correct position, on account of firstly the shadow action of the dykes of the screen and secondly the inevitable scattering and reflection of light at these dykes. In the event of insufficient curing, this can lead to the resist partially flaking off during printing as a result of contact with the squeegee. This leads to contamination of the printing ink or paste with resist material and/or to screen openings becoming blocked. In addition, the accuracy of the printed image as this flaking continues leaves something to be desired. Scattering of light at the dykes may have the same undesirable consequences. Furthermore, a resist layer on the squeegee side of the stencil has no function. It becomes worn as a result of contact with the squeegee, and will thus be able to contaminate the printing paste or ink and/or to block the screen openings.

These drawbacks of U.S. Pat. No. 4,302,528 are avoided with the method according to the invention, aimed at producing screen material which is coated with resist material protected with a protective film on just one side.

As has already been stated, it is preferable for photosensitive resist material to be used in the method according to the invention. Material which can be processed with the aid of high-energy radiation, for example a laser, or mechanically in order to form a preform of an image to be printed in the layer can also be used.

It is usual for the method also to include a step c) of drying the screen with resist layer and protective film obtained in step b). During this step c), the water/solvent is removed from the resist of the (intermediate) product obtained in step b). The drying is preferably forced, although drying in air at ambient temperature is possible but requires a long drying time. Examples of forced drying include drying with hot air or infrared radiation, or blowing with air.

To ensure that the resist layer has penetrated well into the screen (without escaping from the openings on the other side), the application of the first resist layer is advantageously carried out in a plurality of substeps of applying partial resist layers, so that the first resist layer is made up of a plurality of sublayers. In this way, the openings in the screen are filled in steps, preferably with intermediate drying of the partial resist layers (with the exception of the last one), and a very high filling level of more than 75%, advantageously more than 80%, can be achieved. This is because the decrease in volume caused by shrinkage of an applied partial layer as a result of drying is compensated for by the application of a following partial layer.

It is advantageous for the resist layer to be applied to the screen under a certain pressure, so that the photosensitive material can flow into the holes in the screen. It is preferable for the application of the resist layer to one side of the screen to be carried out with the aid of a squeegee coating device.

It is preferable for step b) to be carried out while the resist or the partial resist layer applied last is wet. In this case, the resist performs the function of adhesive for bonding the components of the base material to one another.

If, in this preferred embodiment of the method according to the invention, only one resist layer is present during the lamination (i.e. on one side of the screen), that side of the said resist layer which faces towards the other component, namely the protective film, of the base material to be formed is wet. If a resist layer is present both on one side of the screen and on the protective film, one side of at least one of these resist layers, which side faces towards the other resist layer during lamination, is wet.

If the resist layer in the screen is composed of a plurality of partial layers, it is advantageous for a drying step to be carried out after application of a partial layer, in order to dry the partial layer in question, except for the last partial layer, to which the protective film is preferably applied directly, provided that the partial layer applied last, or at least its side remote from the screen material, is still wet. The drying preferably takes place at a temperature which is lower than the curing temperature of the resist material. This ensures that the drying step, more particularly the drying temperature used, does not have any undesirable adverse effect on the exposure of the resist layer with a pattern corresponding to the image to be printed. The drying temperature will be selected as a function of the resist used, for example will be selected to be lower than 100° C., preferably around 50° C. for a water-based resist with a water content of approximately 55%. A temperature which is virtually equal to or even higher than the curing temperature can be used provided that the drying time is so short that curing of the photosensitive material is avoided.

The expression "the resist layer is wet" is to be understood as meaning that on the relevant side of the resist layer, the resist in this state has a viscous nature, with the result that the resist can still be deformed and consequently can flow into the openings between the dykes of the screen if necessary. Furthermore, this produces good bonding between the various components of the base material.

There are various suitable types of screen for the base material, such as an optionally galvanized woven plastic fabric, a woven metal mesh, a galvanized knitted or woven fabric of plastic filaments or metal wires, and screens formed by electroforming. Electroformed screens, in particular made from nickel, are preferred, since, on account of the electroforming process, they inherently have a very planar surface, which makes a positive contribution to the smoothness of the resist layer in the base material. This contrasts with a woven fabric, in which the filaments or wires cross over one another at the junctions.

The screen preferably has a mesh number of from 70 to 500. There are no restrictions on the shape of the screen openings in the screen. Suitable examples include circular, square or hexagonal openings.

As has already been briefly indicated above, the protective film may be or have been provided with an additional resist layer on one side prior to the lamination step. In this case, which is preferred with a view to good adhesion of the various components to one another and filling of the screen openings, that side of the additional resist layer on the protective film which is brought into contact with the first resist layer is at least wet during step b) of applying the protective film to the first resist layer on the screen. The additional resist layer can likewise be applied to the protective film in a plurality of substeps.

It is preferable for the method according to the invention to be carried out continuously. In this case, a web of the screen material is supplied continuously and coated with the first resist layer in one or more coating steps, in which case, if desired, one or more drying steps can be carried out between the coating steps, after which the protective film (or its additional resist layer) is laminated to the web of screen material having a first resist layer. As has already been stated, in this context it is necessary for at least one side of one of the resist layers to be wet. The web of screen material can in this case be unwound from a stock reel, as can the protective film. After lamination and drying of the base material assembled in this way, this base material can be wound up again.

The lamination itself preferably takes place under a certain pressure, in order to ensure that the viscous resist material can be deformed and flow out where necessary, and also to produce good adhesion between the various components. The temperature during lamination may be in the range from room temperature to 70° C.

In the method according to the invention, it is preferable to use a roll which is compressible. It is advantageous to use a roll which is slightly compressible, i.e. slightly deformable, so that the roll can correct minor unevenness in the contact surface of the screen. It is advantageous for the roll to comprise a rubber roll made from hard rubber with a hardness of 70-90 Shore, preferably in combination with a counterpressure roll with a higher hardness, preferably made from metal.

There are no particular restrictions on the thickness of the first resist layer and if appropriate the additional resist layer on the protective film, but this thickness is to some extent dependent on the end use of the base material. The thickness of the resist layer in the base material is generally from a few micrometers to a few tens of micrometers. If a resist layer is provided both on the screen and on the protective film, the resist material of these layers preferably has the same composition, and therefore the same relevant properties, such as drying rate, viscosity and curing rate, etc.

Experiments have shown that an Rz value of 10 micrometers or less can be achieved in the present method. This leads to a considerable improvement in the printing result when using the product obtained by the method according to the invention.

As an alternative to using the adhesive effect of wet resist, it is possible to make use of an adhesive per se. In that case, the protective film is bonded to the first resist layer with the aid of an adhesive, which has advantageously been provided on the protective film beforehand.

A further aspect of the invention relates to a base material for screen-printing which comprises a screen, a resist layer of resist material and a protective film, the screen comprising a network of dykes which delimit openings, the resist layer and the protective film being provided on one side of the screen, and the filling level of the resist layer between the dykes (defined as the quotient of the thickness or height of the resist layer in the openings of the screen and the thickness of the screen * 100%) of the screen being greater than 60%, more preferably more than 75%, most preferably more than 80%. Furthermore, if a cross section through the base material is studied with the aid of a microscope, it emerges that the uncovered surface of the resist in a screen opening is flatter than with the known material, in which this surface has more of a concave meniscus shape.

In the case of the base material according to the invention, the distance from the dykes of the screen to the surface of the resist layer on the side of the protective film is uniform. This distance is defined as the shortest distance between the dykes and said surface of the resist layer. In this context, uniform means that the variation in distance is slight, generally less than ±5 micrometers, preferably a variation of less than ±2 micrometers.

On account of the fact that in the method according to the invention resist material is applied in and on the screen prior to lamination, the depth of penetration of the resist layer between the dykes of the screen is also more uniform than in the case of the known product. The height is in this case measured as the distance between that point of a dyke of the screen which lies deepest in the resist layer and the surface of the resist layer between two dykes on the free side of the screen, i.e. the side which faces away from the protective film. The variation in thickness is slight, preferably less than ±5 micrometers.

Various polymeric materials, such as polyethylene, polypropylene, polyester, polyvinyl chloride, polyacrylate, PET, PEI, PBT, PC, etc., are suitable for the protective film. There are no restrictions on the thickness of the film, and this thickness is, for example, between 25 and 500 micrometers.

The resist which is used for the resist layer is advantageously a photosensitive resist based on organic solvents or water. The resist preferably has a dry matter content of between 30 and 60%. The particle size of the resist is preferably less than 25 micrometers, more preferably less than 10 micrometers. The viscosity of the resist is advantageously between 1000 and 4000 cP. The resist advantageously comprises constituents selected from the group consisting of UV acrylate resin, polyvinyl acetate, polyvinyl alcohol, alkyd, epoxy, melamine, bichromate, diazo compound and waterborne SBQ photopolymer. As has already been noted above, if applicable it is advantageous to use the same resist for the first resist layer on the screen and the additional resist layer on the protective film.

If applicable, the surface tension of the resist which is applied to the protective film is preferably less than or equal to the surface tension of the film, in order to achieve favourable flow of the resist on the film when applying the additional resist layer. If desired, the surface tension of the film can be (temporarily) increased by a pretreatment in a corona treatment device.

The invention also relates to a device for producing base material for screen printing in web form which as components comprises a screen, a layer of resist material and a protective film, which device comprises conveyor means for moving a web of screen material, coating means for applying resist material to one side of a moving web of screen material, feed means for supplying protective film, joining means for bringing the protective film into contact with the resist material of the web of screen material provided with a layer of resist material, and drying means for drying a treated web of screen material. According to the invention, the function of coating screen material in web form with resist material and the function of joining screen material coated with resist material are integrated in one device. The drying means are designed to dry partial resist layers, if applicable, and to dry the combined base material comprising a screen, resist layer and protective film.

Advantageously, the conveyor means comprise unwinding means for unwinding a web of screen material from a stock reel, as well as winding means for winding up a treated web of screen material onto a reel. In this context, the expression "treated web of screen material" is to be understood as meaning a web of screen material to which the first resist layer or one or more partial resist layers have been applied or a web of screen material with resist layer and protective film (in other words the base material). On account of the use of unwinding means and winding means, the device is suitable for producing long webs of base material. Furthermore, these means enable the device to be used for applying the resist layer to one side of the screen material in a number of steps. In this case, in each step apart from the last one, the screen material is unwound from the stock reel, coated, dried and wound up on an empty reel. The latter reel is then transferred to the unwinding position, and the stock reel which is now empty is transferred to the winding position, after which the following substep can be carried out in the manner described. Alternatively, the coated material can be unwound in the opposite direction from the reel which has just been wound, coated, dried and wound up again, provided that the drying means and/or coating means are present in duplicate in order to enable the treatments to be carried out in the prescribed order. In the last substep, the drying means are switched off or set to a lower intensity. Then, the protective film is applied to the wet coated screen material, which is then wound up. The base material obtained in this way can then be passed through the drying means, with the coating device switched off.

Examples of suitable coating devices include a patterned roll, a squeegee, stencil or screen, so-called slot coater, slide coater and roll coater. Cf "Liquid film coating" by S. F. Kistler and P. M. Schweizer, Chapmann & Hall, London, 1997. The coating means preferably comprise a squeegee coating device.

The joining means advantageously comprise an assembly made up of a roll and a counterpressure roll. The counterpressure roll makes direct contact with the screen material (preferably electroformed screen material). The protective film comes into contact with the pressure-exerting roll, preferably a rubber pressure-exerting roll. The arrangement of the roll and counterpressure roll is advantageously such that the film is partly guided onto the pressure-exerting roll before being applied to the coated screen material.

As an alternative, the assembly of protective film and screen material with resist layer can be pulled over a roll under tensile force, with the protective film coming into contact with the said roll. There is no need for a counterpressure roll in this case.

The drying means comprise, for example, infrared dryers, although other drying means as described in the detailed discussion of the method according to the invention or combinations thereof can also be used.

To prevent resist material which has not (yet) dried from flowing out of the openings in the screen material under the force of gravity, in an advantageous embodiment of the device according to the invention the coating means are arranged along a vertical section of the movement path of the web of screen material.

The device may also comprise discharge means for removing an electrostatic charge on the protective film.

BRIEF DESCRIPTION OF THE DRAWINGS

The invention will now be explained with reference to the appended drawing, in which.

DETAILED DESCRIPTION OF PREFERRED EMBODIMENTS

Figure 1:
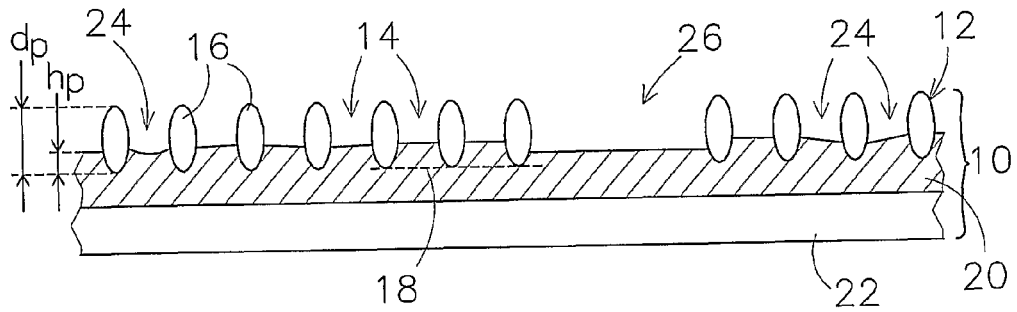
FIG. 1 diagrammatically depicts a cross section through base material obtained with the aid of the method according to the prior art.

FIG. 1 illustrates a base material 10 in accordance with the prior art. This base material 10 comprises a screen material 12 comprising openings 14 which are separated by dykes 16. A layer 20 of photosensitive material is present on one side 18 (indicated by dashed line) of the screen 12, which layer 20 has partly penetrated into the openings 14 in the screen 12. On the other side, the resist layer 20 is protected by protective film 22. On account of capillary effects, there are local positions where although the distribution of resist over the surface of the screen material 12 is good, the distribution within the screen openings 14 of the screen material 12 leaves something to be desired. Positions of this type are denoted by reference numeral 24 in FIG. 1. Consequently, in many cases at these spots the resist has penetrated less far into the screen material 12. Incidentally, there may also be what are known as pinholes, i.e. locally absent dykes, in the screen material 12. A pinhole of this type is indicated by arrow 26 in FIG. 1. Here too, the photosensitive material has penetrated less far into the screen 12 and has reduced adhesion to the surrounding dykes 16. The lower penetration depth into the screen at these positions 24 and pinhole 26 may have a deleterious effect on print quality. The height of the resist layer 20 in the openings 14 between the dykes 16, calculated from side 18, is denoted by $h_p$, and the thickness of the screen is denoted by $d_p$. The ratio $h_p/d_p$ is the filling level and is less than 40%.

Figure 2:
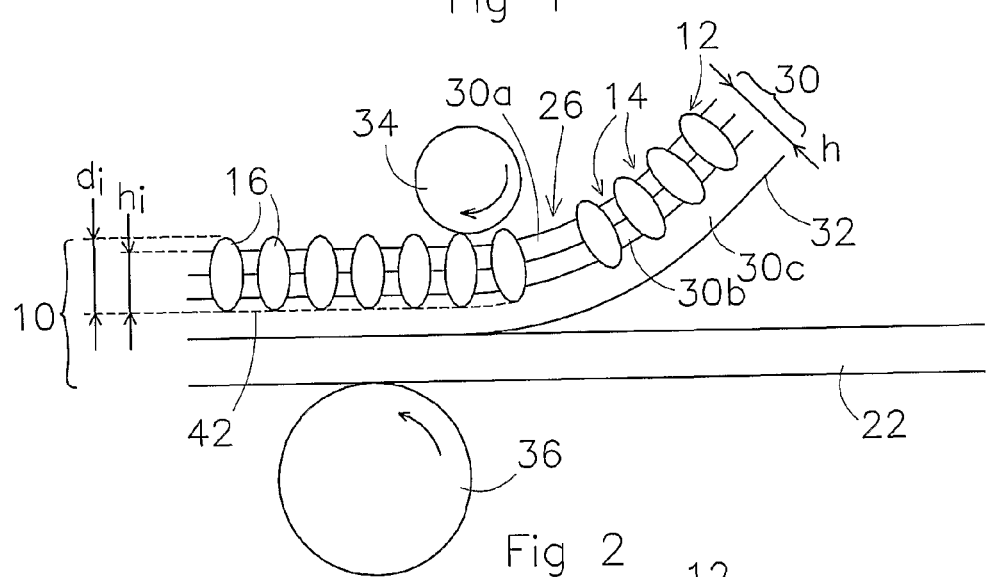
FIG. 2 illustrates a first embodiment of the method according to the invention.

FIG. 2 illustrates an embodiment of the method for producing a base material for screen-printing according to the invention. In this FIG. 2, components which correspond to those shown in FIG. 1 are denoted by the same reference designations. According to the invention, the screen material 12, comprising dykes 16 which delimit screen openings 14, is firstly provided on one side with a first resist layer, denoted overall by reference numeral 30, which, by way of example, has been applied under pressure in a number of steps, for example three steps, with the aid of a squeegee coater. The partial layers are denoted by 30a, b and c, respectively. As a result, a virtually uniform thickness and penetration depth of the resist layer 30 in the screen 12 is achieved, despite the fact that in this case too there is a pinhole 26. There is a low risk of air inclusions if the resist layer 30 is built up in substeps. A drying step is carried out after application of the first resist layer parts 30a and 30b. Finally, a last partial layer 30c of resist material is applied, to which the protective film 22 is applied under a slight pressure while this partial resist layer 30c, or at least the free surface 32 thereof, is still wet; in this embodiment, the pressure is applied by pressure-exerting roll 34 with a surface consisting of hard rubber, and a counterpressure roll 36 made from metal. After the assembly has been dried, the result is a base material with a resist layer and a protective film on one and the same side, with a smooth surface of the resist layer 30, which has a uniform depth of penetration into the screen 12. This depth of penetration or thickness is in this figure denoted by $h_t$ between the contact surface 42 (corresponding to side 18 in the prior art) of the dykes 16 in the resist layer 30 and the free surface of the resist layer 30 between the dykes 16. The total thickness of the resist layer 30 is denoted by h. The thickness of the screen 12 is denoted by $d_f$. The filling level is more than 80%.

Figure 3:
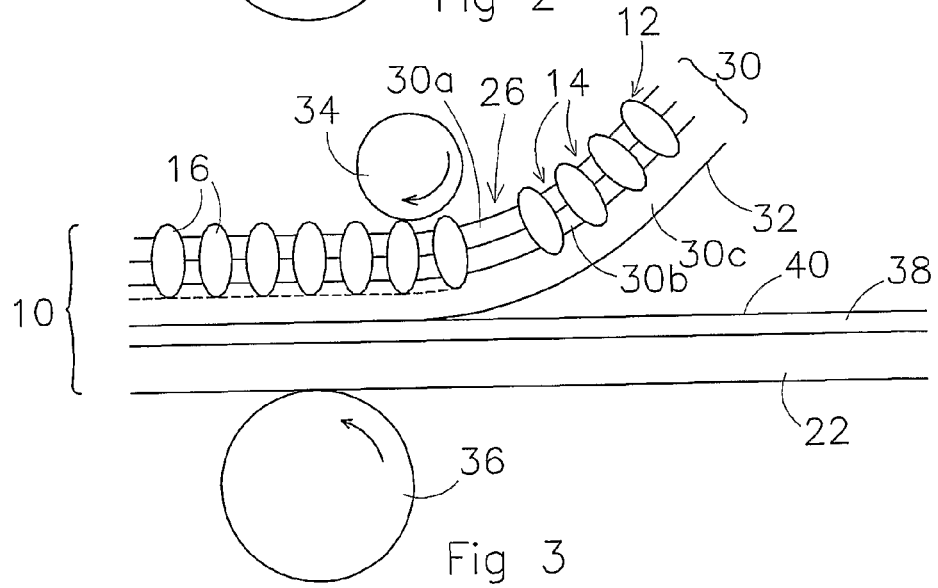
FIG. 3 shows another preferred embodiment of the method according to the invention.

FIG. 3 shows an alternative method, in which the protective film 22 is also provided with an additional resist layer 38 of photosensitive material, prior to lamination. In this case, the lamination step is carried out while at least one side 32 and/or 40 of at least one of the resist layers 30 and 38 is wet.

Figure 4:
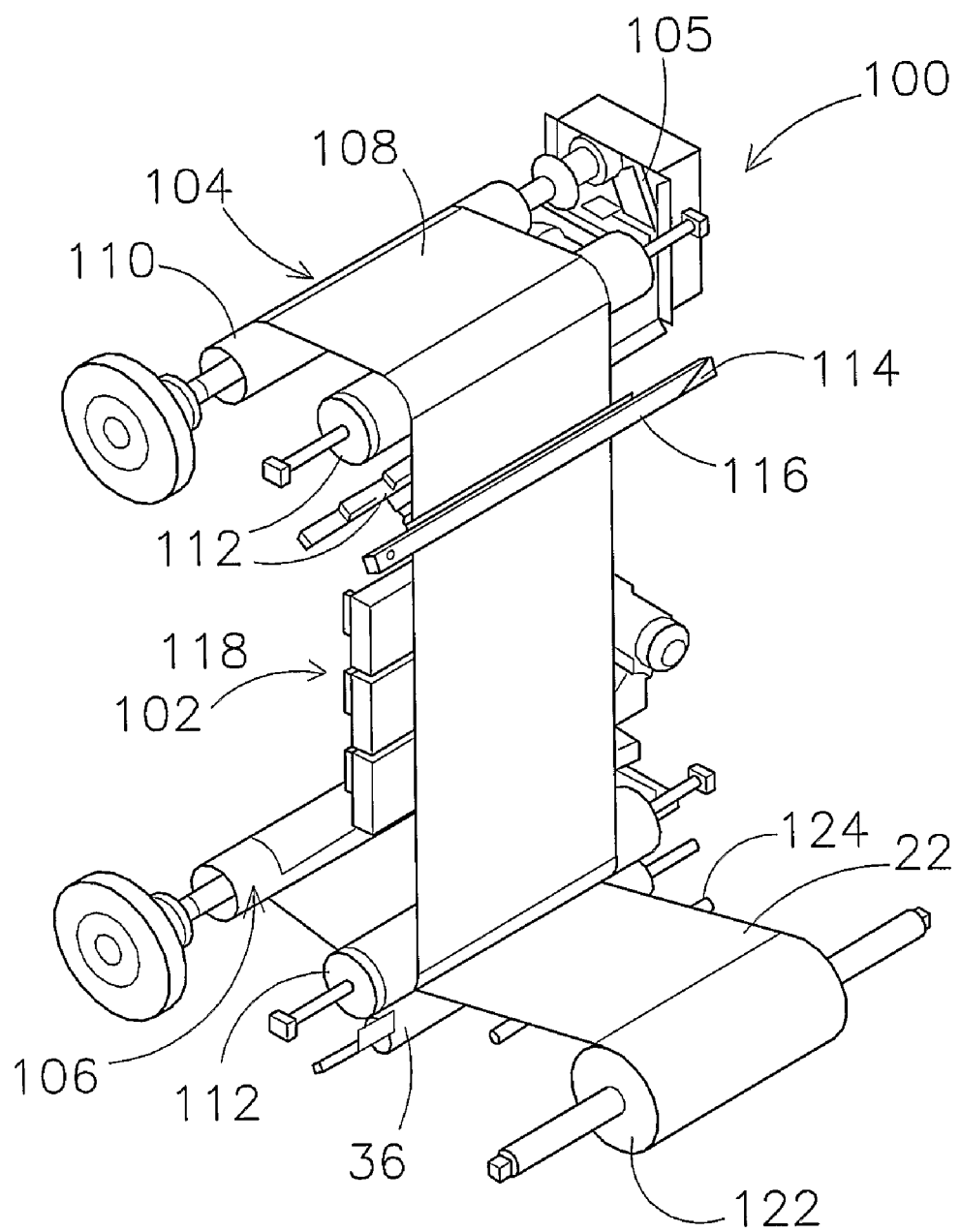
FIG. 4 shows an embodiment of a device according to the invention.

FIG. 4 shows an embodiment of a device 100 according to the invention. The device 100 comprises a frame (not shown), a conveyor mechanism for moving screen material 12 in web form, coating means for applying a (partial) layer 30, 30*a-c* of resist material to one side of the screen material, drying means 102 for drying base material and/or screen material coated with resist material, and joining means for applying protective film to coated screen material. The conveyor mechanism comprises a top winding unit 104 and a bottom winding unit 106. Each unit may have a dedicated drive 105, so that a unit 104, 106 is suitable for both unwinding and winding. In the embodiment illustrated, the unit 104 is used to unwind a web 108 of screen material 12 from a stock reel 110. Base material or screen material coated with resist is being wound up at unit 106. Furthermore, the conveyor mechanism comprises guide rolls 112 for guiding a web of material through the device 100. In the embodiment illustrated, the coating means comprise a squeegee device 114, comprising a knife box 116 on that side of the web material which is to be coated, and a counterpressure knife 118 on the other side. The level of the resist material in the knife box 116 is as far as possible kept constant in order to apply a (partial) resist layer with a uniform thickness, advantageously below the position of the tip of the counterpressure knife 118. Drying of screen material coated with a partial resist layer is carried out with the aid of IR dryers 102. Drying is not carried out or not completely carried out after application of the last partial resist layer, but rather protective film 22 in web form which has been unwound from a stock reel 122 is partially guided over a rubber guide roll 112 and then brought into contact with wet coated screen material. The guide roll 112 in question in this case functions as a roll (denoted by reference numeral 34 in FIGS. 2 and 3). The base material 10 obtained in this way is wound up in the unit 106 and then dried. Discharge means 124 are arranged above and below (although only the latter is illustrated, for the sake of clarity) the path of the protective film 22 from stock reel 122 to the guide roll 112.

The method according to the invention achieves a very uniform depth of penetration or filling level for the resist material, which has been coated and protected on one side, in the screen, as well as a very smooth surface of the resist layer in the base material ultimately obtained.

What is claimed is:

1. A method for producing a base material for screen printing including as components a screen, a resist layer of resist material and a protective film, wherein the screen comprises a network of dykes which delimit openings, the method comprising:
    applying a first resist layer to just one side of the screen, comprising filling the level of the first resist layer between the dykes of the screen to greater than about 60%, the maximum filling level being 100%; and
    then applying the protective film to the first resist layer on the screen.

2. The method according to claim 1, in which the resist material comprises a photosensitive resist material.

3. The method according to claim 1, further comprising:
    drying the screen with the first resist layer and the protective film applied.

4. The method according to claim 1, further comprising:
    applying the protective film while the first resist layer is wet.

5. The method according to claim 1, further comprising:
    applying the first resist layer to the screen in a plurality of sub-steps, each sub-step comprising applying a partial resist layer.

6. The method according to claim 5, further comprising:
    drying the partial resist layer which has been applied in a sub-step if a subsequent partial resist layer is to be applied.

7. The method according to claim 5, further comprising:
    applying the protective film while the last partial resist layer is wet.

8. The method according to claim 1, in which the resist layer is applied to the screen with the aid of a squeegee coating device.

9. The method according to claim 1, wherein the protective film is provided on one side with an additional resist layer, and while applying the protective film the additional resist layer is brought into contact with the first resist layer.

10. The method according to claim 9, wherein while applying the protective film, that side of the additional resist layer which is brought into contact with the first resist layer is wet.

11. The method according to claim 1, which is carried out continuously.

12. The method according to claim 1, further comprising bonding the protective film to the first resist layer with the aid of an adhesive.

* * * * *